United States Patent
Chen et al.

(10) Patent No.: US 8,846,422 B2
(45) Date of Patent: Sep. 30, 2014

(54) METHOD FOR MANUFACTURING LED PACKAGE STRUTURE AND METHOD FOR MANUFACTURING LEDS USING THE LED PACKANGE STRUTURE

(71) Applicant: Advanced Optoelectronic Technology, Inc., Hsinchu Hsien (TW)

(72) Inventors: Pin-Chuan Chen, Hsinchu (TW); Hsin-Chiang Lin, Hsinchu (TW); Lung-Hsin Chen, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/714,418

(22) Filed: Dec. 14, 2012

(65) Prior Publication Data

US 2013/0236996 A1    Sep. 12, 2013

(30) Foreign Application Priority Data

Mar. 6, 2012 (CN) .......................... 2012 1 0056428

(51) Int. Cl.
*H01L 21/00* (2006.01)
*H01L 33/60* (2010.01)

(52) U.S. Cl.
CPC ......... *H01L 33/60* (2013.01); *H01L 2933/0033* (2013.01)
USPC ............................................. 438/27; 438/116

(58) Field of Classification Search
CPC ......... H01L 33/00; H01L 21/56; H01L 27/15; H01L 25/167; H01L 27/153; H01L 27/32
USPC ........ 257/88, 98, E33.059, E33.072, 79, 100, 257/E33.067, E23.005; 438/26, 27, 28, 116
See application file for complete search history.

(56) References Cited

U.S. PATENT DOCUMENTS

| | | | |
|---|---|---|---|
| 6,888,168 B2 * | 5/2005 | Fjelstad ............................ | 257/81 |
| 2008/0070346 A1 * | 3/2008 | Lin et al. ........................ | 438/107 |
| 2009/0283779 A1 * | 11/2009 | Negley et al. ..................... | 257/88 |
| 2011/0053297 A1 * | 3/2011 | Andrews .......................... | 438/26 |
| 2012/0057105 A1 * | 3/2012 | Jeong ............................... | 349/96 |

FOREIGN PATENT DOCUMENTS

| | | |
|---|---|---|
| JP | 2007-273591 A | 10/2007 |
| JP | 2008-166611 A | 7/2008 |
| TW | 200837976 A | 9/2008 |

* cited by examiner

*Primary Examiner* — Jarrett Stark
*Assistant Examiner* — Shahed Ahmed
(74) *Attorney, Agent, or Firm* — Novak Druce Connolly Bove + Quigg LLP

(57) ABSTRACT

A method for manufacturing an LED package structure is disclosed wherein a substrate with a first electrode, a second electrode and a connecting layer is provided. A photoresist coating is provided to cover the substrate, the first electrode, the second electrode and the connecting layer. A portion of the photoresist coating is removed to define a groove corresponding to the connecting layer. A metal layer is formed in the groove to join the connecting layer. A remaining portion of the photoresist coating is removed and a concave is formed and surrounded by the metal layer. A reflective layer is formed on an inside surface of the concave to join the metal layer to form a reflective cup. An LED die is mounted in the reflective cup and electrically connects with the first and second electrodes.

20 Claims, 14 Drawing Sheets

METHOD FOR MANUFACTURING LED PACKAGE STRUTURE AND METHOD FOR MANUFACTURING LEDS USING THE LED PACKANGE STRUTURE

BACKGROUND

1. Technical Field

The present disclosure relates to methods for manufacturing light emitting devices, and more particularly, to a method for manufacturing an LED (light emitting diode) package structure and a method for manufacturing LEDs using the LED package structure, wherein reflective layers of the LEDs are formed by photolithography and electroplating.

2. Description of Related Art

As a new type of light source, LEDs are widely used in various applications. An LED often includes a base, a pair of leads formed in the base, a light emitting chip mounted on the base and electrically connected to the leads, a reflecting cup surrounding the chip, and an encapsulant sealing the chip. Generally, the reflecting cup is made of a base material such as polymethylmethacrylate (PMMA), epoxy resin, silicone. A reflecting film is formed on the base material for reflecting light emitted from the chip. However, the materials for forming the reflecting cup are deformable materials, especially at a raised temperature. Thus, after use of the LED for a long time, the reflecting cup may be deformed by the heat generated by the LED chip thereof, to thereby cause the reflecting film to be deformed or even separated from the base material. Such problem will unfavorably affect the light efficiency of the LED.

What is needed, therefore, is a method for manufacturing an LED package structure and a method for manufacturing LEDs using the LED package structure which can overcome the limitations described above.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EMBODIMENTS

Referring to FIGS. 1-11, a method for manufacturing an LED package structure 100 in accordance with a first embodiment of the present disclosure is shown. The method mainly includes several steps as discussed below.

Figure 1:
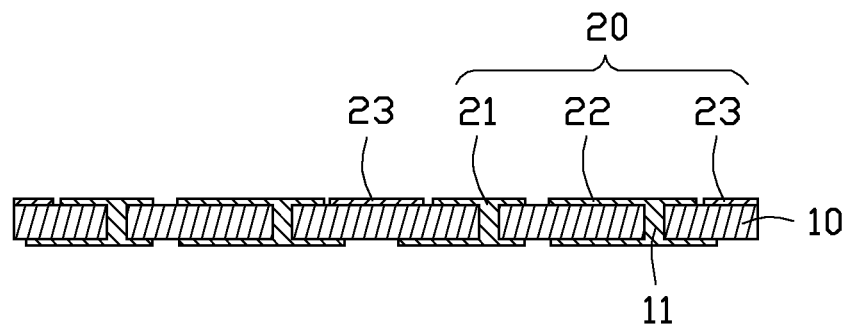
FIG. 1 shows a first step of a method for manufacturing an LED package structure in accordance with a first embodiment of the present disclosure.
Figure 2:
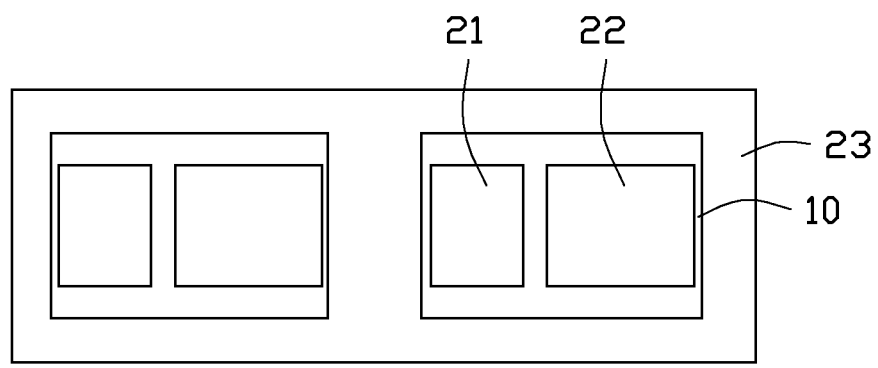
FIG. 2 shows a top view of FIG. 1.

Firstly, a substrate 10 is provided as shown in FIGS. 1-2. The substrate 10 is made of non-metallic materials such as ceramics or silicon. A plurality of slots 11 are defined throughout a top surface and a bottom surface of the substrate 10 by ways of mechanical drilling or etching, etc. A plating layer 20 is formed on the top surface and the bottom surface of the substrate 10. The plating layer 20 includes at least one pair of a first electrode 21 and a second electrode 22. The plating layer 20 further includes a connecting layer 23 spaced from the first electrode 21 and the second electrode 22. The plating layer 20 is made of metal materials such as copper or aluminum. The first electrode 21 includes an upper section located on the top surface of the substrate 10, a lower section located on the bottom surface of the substrate 10, and a middle section located within a corresponding slot and interconnecting the upper section and the lower section. The second electrode 22 has a structure similar to that of the first electrode 21. The middle sections of the first electrode 21 and the second electrode 22 fill the slots 11. The connecting layer 23 is formed only on the top surface of the substrate 10. The connecting layer 23 surrounds each pair of the upper sections of the first electrode 21 and the second electrode 22 on the top surface of the substrate 10. The first electrode 21, the second electrode 22 and the connecting layer 23 are separated and electrically insulated from each other.

Figure 3:
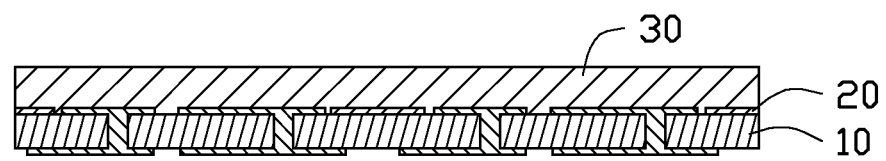
FIG. 3 shows a second step of the method for manufacturing the LED package structure in accordance with the first embodiment of the present disclosure.

As shown in FIG. 3, a photoresist coating 30 is provided to cover the substrate 10. The photoresist coating 30 covers the top surface of the substrate 10, the upper sections of the first electrode 21 and the second electrode 22, and the connecting layer 23 on the top surface of the substrate 10. In this embodiment, the photoresist coating 30 is reverse photoresist for forming recesses with predetermined shapes in a next lithography process.

Figure 4:
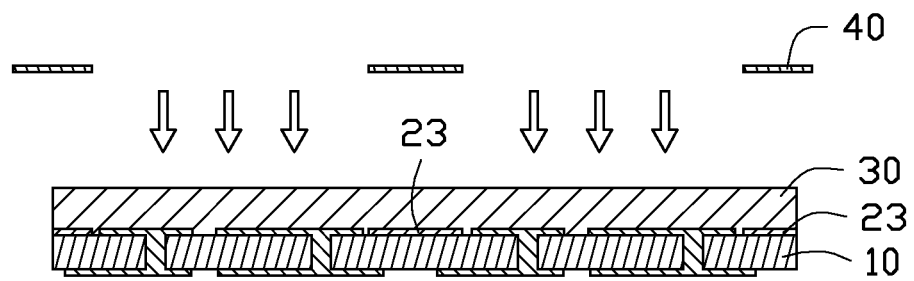
FIG. 4 shows a third step of the method for manufacturing the LED package structure in accordance with the first embodiment of the present disclosure.

As shown in FIG. 4, a mask 40 is provided above the photoresist coating 30. The mask 40 does not wholly cover the photoresist coating 30 in a manner that some portions of the photoresist coating 30 corresponding to the connecting layer 23 are covered, and the other portions of the photoresist coating are exposed.

The exposed photoresist coating 30 is irradiated with UV light. New polymer keys of the photoresist coating 30 are generated after being irradiated, so that force between the molecules of the photoresist coating 30 is strengthened, resulting in that the irradiated portions of the photoresist coating 30 are insoluble in developer. Due to covering of the mask 40, the portions of the photoresist coating 30 immediately below the mask 40 are not irradiated by the UV light.

Figure 5:
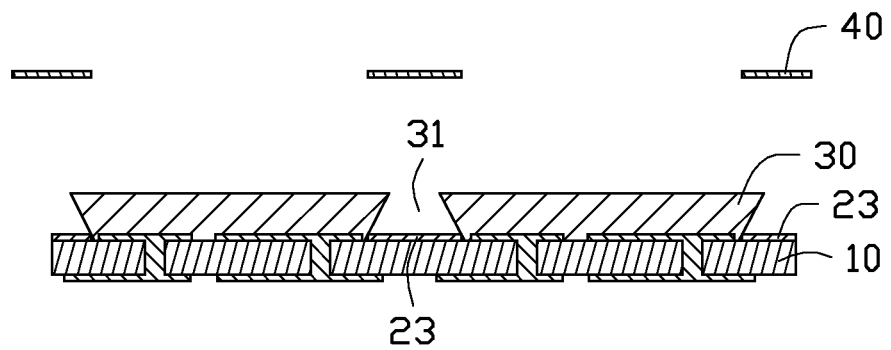
FIGS. 5-6 show a fourth step of the method for manufacturing the LED package structure in accordance with the first embodiment of the present disclosure.
Figure 6:
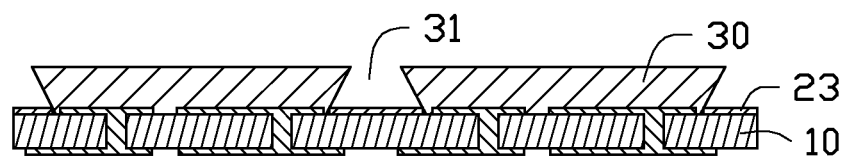

As shown in FIGS. 5-6, the mask 40 is removed. A groove 31 is defined by further removing the non-irradiated portions of the photoresist coating 30. The non-irradiated portions of the photoresist coating 30 can be removed by dipping the substrate 10 into a developing liquid. By controlling conditions of exposure and developing, the groove 31 can be defined to have a predetermined size and shape. In this embodiment, the connecting layer 23 is exposed through the groove 31 by removing portions of the photoresist coating 30 covering the connecting layer 23. A cross-section of the groove 31 has a trapezoidal shape with a bottom edge being longer than a top edge thereof.

Figure 7:
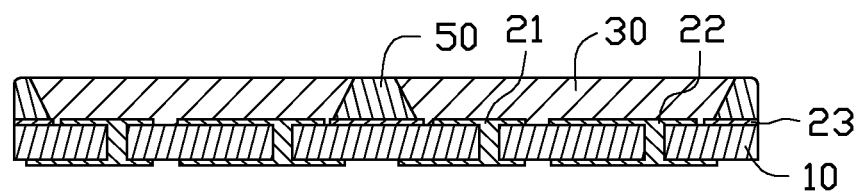
FIG. 7 shows a fifth step of the method for manufacturing the LED package structure in accordance with the first embodiment of the present disclosure.

As shown in FIG. 7, a metal layer 50 is formed in the groove 31. The metal layer 50 directly connects the connecting layer 23. In this embodiment, the metal layer 50 fully fills the groove 31. The metal layer 50 partially covers a top face of the connecting layer 23. A height of the metal layer 50 is equal to a height of the photoresist coating 30. The metal layer 50 is electroplated on the connecting layer 23. Due to the metal layer 50 and the connecting layer 23 are both made of metal materials, the metal layer 50 and the connecting layer 23 can be combined together firmly and reliably.

Figure 8:
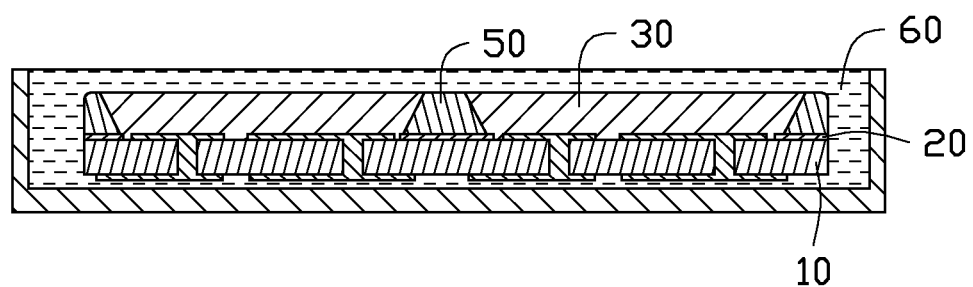
FIGS. 8-9 show a sixth step of the method for manufacturing the LED package structure in accordance with the first embodiment of the present disclosure.
Figure 9:
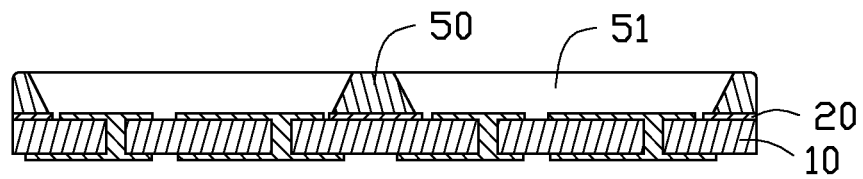

As shown in FIGS. 8-9, a container containing a kind of particular liquid 60 is provided. The remaining photoresist coating 30 is dissolved by dipping the substrate 10 in the liquid 60. After the remaining photoresist coating 30 is totally dissolved in the liquid 60, the substrate 10 is brought out of the liquid 60. Concaves 51 are defined at positions of the dissolved photoresist coating 30. Each concave 51 is surrounded by the metal layer 50. A pair of the first electrode 21 and the second electrode 22 is exposed in each concave 51. Parts of the connecting layer 23 not covered by the metal layer 50, are exposed. The substrate 10 is further cleaned and dried after being brought out of the liquid 60.

Figure 10:
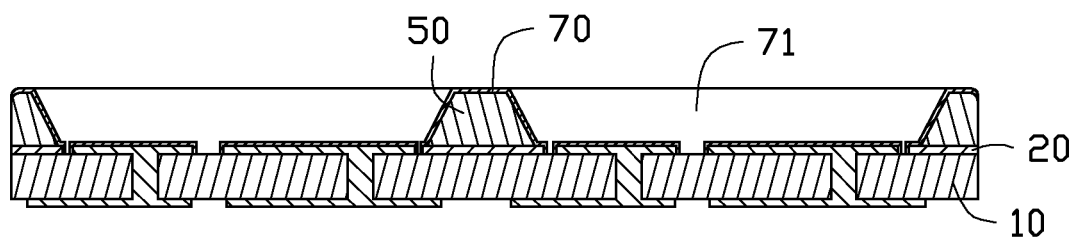
FIG. 10 shows a seventh step of the method for manufacturing the LED package structure in accordance with the first embodiment of the present disclosure.

As shown in FIG. 10, a reflective cup 71 is formed by plating a reflective layer 70 on an inside surface of each concave 51. The reflective layer 70 covers the metal layer 50, the first electrode 21, the second electrode 22 and the exposed parts of the connecting layer 23. Preferably, the reflective layer 70 is a silver layer.

Because the metal layer 50 is formed on the connecting layer 23 by electroplating, the metal layer 50 can be made thin enough during the electroplating process. Accordingly, a thickness of the package structure 100 can be controlled to be small. Furthermore, the metal layer 50 is not deformed due to a raised temperature, whereby the reflective layer 70 can be reliably fixed on the metal layer 50. In addition, the joint between two metal materials by electroplating is firm, whereby the joining reliability of the reflective layer 70 to the metal layer 50 is further enhanced.

Figure 11:
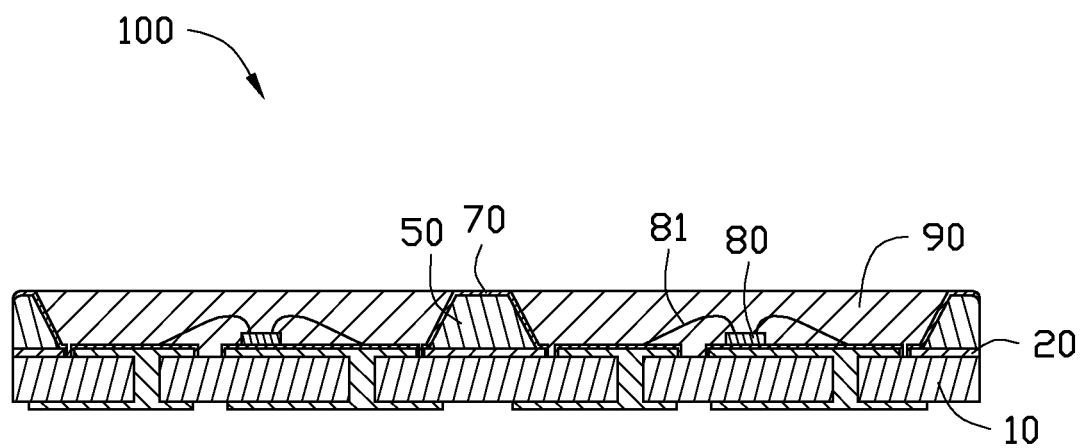
FIG. 11 shows an eighth step of the method for manufacturing the LED package structure in accordance with the first embodiment of the present disclosure.

Referring to FIG. 11, an LED chip 80 is attached on the second electrode 22 and electrically connected to the first electrode 21 and the second electrode 22 by two gold wires 81. A thickness of the chip 80 is smaller than depth of the reflective cup 71. An encapsulant 90 is formed inside the reflective cup 71 and covers the LED chip 80. The encapsulant 90 is made of transparent materials such as epoxy, resin and so on. The encapsulant 90 can be doped with phosphor. By the filling of the encapsulant 90 in the reflective cups 71, the LED package structure 100 in accordance with the present disclosure is completed.

Figure 12:
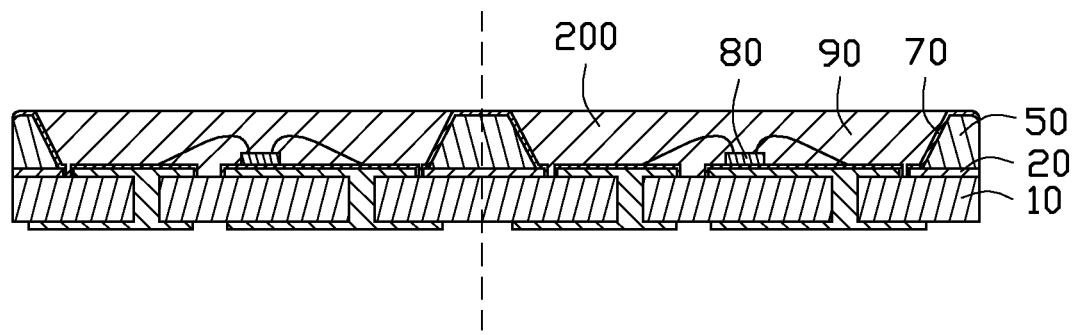
FIG. 12 shows a step of severing the LED package structure of FIG. 11 to obtain LEDs in accordance with a first embodiment of the present disclosure.

As shown in FIG. 12, two LEDs 200 are manufactured by cutting the LED package structure 100 of FIG. 11 through the metal layer 50, the connecting layer 23 and the substrate 10 along a line between the two reflective cups 71. In the first embodiment, the cutting line is at a middle of the metal layer 50.

Figure 13:
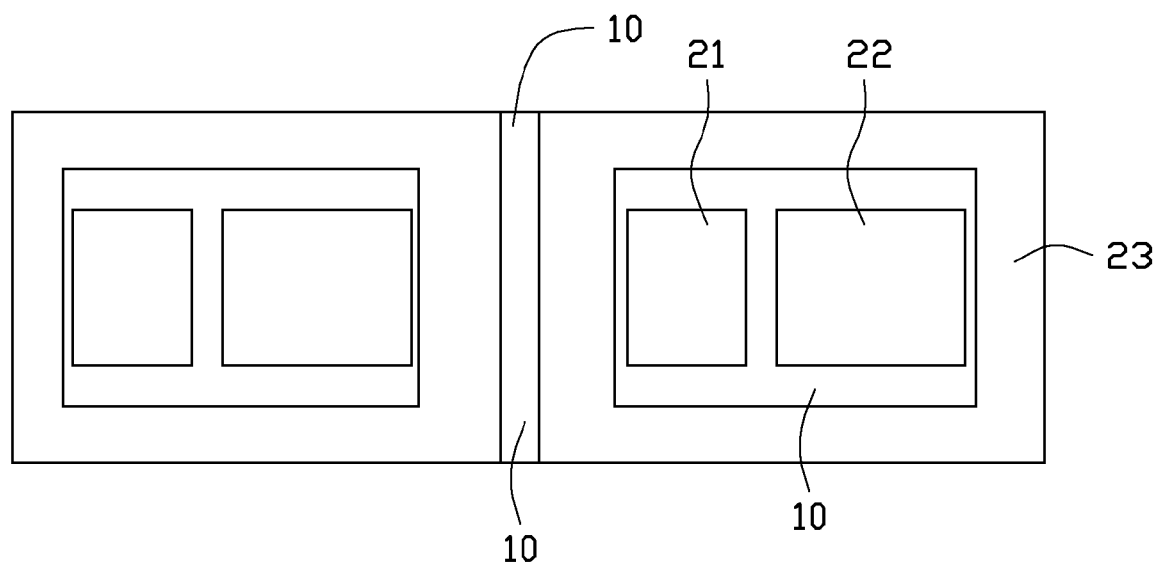
FIG. 13 is a top view, showing a semi-finished product of an LED package structure made by a method in accordance with a second embodiment of the present disclosure.

Referring to FIG. 13, an LED package structure 100 in accordance with a second embodiment of the present disclosure is shown. Different from the first embodiment, the connecting layer 23 of the LED package structure 100 of the second embodiment is divided into a plurality of individual portions. Each individual portion of the connecting layer 23 is an annulus surrounding a corresponding pair of the first electrode 21 and the second electrode 22. The substrate 10 has a band exposed between two neighboring edges of the individual portions of the connecting layers 23. In the next processes, a top surface of the substrate 10 including the band, the first and second electrode 21, 22 and the connecting layer 23 are covered by the photoresist coating 30; the following processing of the second embodiment is the similar to that of the first embodiment, wherein the mask 40 which covers the connecting layer 23 of the first embodiment does not cover the band of the substrate 10 of the second embodiment; the top surface of substrate 10 defining the band is exposed again after exposure and developing of the photoresist coating 30. Because metal layer 50 is formed only on the connecting layer 23, the exposed band of the substrate 10 is not covered by the metal layer 50 during the process of electroplating the metal layer 50. Thus, the metal layer 50 also has two individual portions with a groove defined therebetween corresponding to the exposed band of the top surface of the substrate 10.

Figure 14:
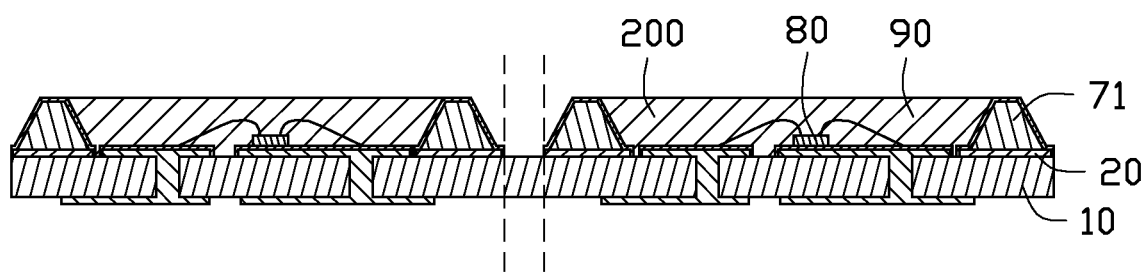
FIG. 14 is similar to FIG. 12, showing a step of severing the LED package structure obtained from the semi-finished product of FIG. 13 to obtain LEDs in accordance with a second embodiment of the present disclosure.

As shown in FIG. 14, accordingly, the two individual portions of the metal layer 50 can be conveniently separated from each other, by cutting the LED package structure through two edges of the exposed band of the substrate 10, evading the metal layer 50. Accordingly two LEDs 200 are obtained.

It is believed that the present disclosure and its advantages will be understood from the foregoing description, and it will be apparent that various changes may be made thereto without departing from the spirit and scope of the present disclosure or sacrificing all of its material advantages, the examples hereinbefore described merely being preferred or exemplary embodiments.

What is claimed is:

1. A method for manufacturing an LED (light emitting diode) package structure, comprising:
   providing a substrate with a first electrode, a second electrode and a connecting layer formed on the substrate, the first electrode, the second electrode and the connecting layer being separated and electrically insulating from each other;
   forming a photoresist coating covering the substrate, the first electrode, the second electrode and the connecting layer;
   removing a portion of the photoresist coating to define a groove corresponding to the connecting layer;
   forming a metal layer in the groove to join the connecting layer;
   removing a remaining portion of the photoresist coating to form a concave surrounded by the metal layer;
   forming a reflective layer on an inside surface of the concave to join the metal layer, the reflective layer and the metal layer cooperatively forming a reflective cup; and
   mounting an LED chip in the reflective cup and electrically connecting the LED chip to the first and second electrodes.

2. The method of claim 1, wherein the groove is defined by using a developing liquid to remove the portion of the photoresist coating.

3. The method of claim 2, wherein the step of removing the portion of the photoresist coating comprises:
providing a mask to shade the portion of the photoresist coating;
irradiating the remaining portion of the photoresist coating by ultraviolet light;
removing the mask; and
removing the portion of the photoresist coating by using the developing liquid.

4. The method of claim 3, wherein the photoresist coating is a reverse photoresist.

5. The method of claim 1, wherein the remaining portion of the photoresist coating is removed by dipping the substrate in a dissolving liquid.

6. The method of claim 1, wherein a cross-section of the groove has a trapezoidal shape tapering from bottom to top.

7. The method of claim 1, wherein the metal layer fully fills the groove.

8. The method of claim 1, wherein the reflective layer is formed by electroplating.

9. The method of claim 8, wherein the reflective layer is a silver layer.

10. The method of claim 1, wherein the substrate further comprises another first electrode and another second electrode on the substrate, the first electrode and the second electrode, the another first electrode and the another second electrode being surrounded by the connecting layer.

11. The method of claim 10, wherein connecting layer comprises at least two individual portions, one individual portions of the connecting layer surrounding the first electrode, the second electrode, and another individual portion of the connecting layer surrounding the another first electrode and the another second electrode.

12. The method of claim 11, wherein the substrate has a band exposed between two adjacent edges of the at least two individual portions of the connecting layer.

13. The method of claim 1, wherein the substrate defines slots throughout a top surface and a bottom surface thereof, the first electrode and the second electrode each comprising an upper section formed on the top surface of the substrate, a lower section formed on the bottom surface of the substrate, and a middle section extending through a corresponding slot to connect the upper section with the lower section.

14. The method of claim 13, wherein the slots are defined by mechanical drilling or etching the substrate.

15. A method for manufacturing an LED (light emitting diode), comprising:
providing a substrate with a first electrode, a second electrode and a connecting layer formed on the substrate, the first electrode, the second electrode and the connecting layer being separated from each other;
forming a photoresist coating covering the substrate, the first electrode, the second electrode and the connecting layer;
removing a portion of the photoresist coating to expose the connecting layer, a remaining portion of the photoresist coating defining a groove corresponding to the removed portion;
forming a metal layer in the groove to join the connecting layer;
removing the remaining portion of the photoresist coating to form a concave surrounded by the metal layer;
forming a reflective layer on an inside surface of the concave to join the metal layer, the reflective layer and the metal layer cooperatively forming a reflective cup;
attaching a chip in the reflective cup and electrically connecting the chip to the first electrode and the second electrode; and
forming an encapsulant inside the reflective cup and covering the chip.

16. The method of claim 15, wherein the groove is defined by using a developing liquid to remove the portion of the photoresist coating.

17. The method of claim 16, wherein the step of removing the portion of the photoresist coating comprises:
providing a mask to shade the portion of the photoresist coating;
irradiating the remaining portion of the photoresist coating by ultraviolet light;
removing the mask; and
removing the portion of the photoresist coating by using the developing liquid.

18. The method of claim 15, the remaining portion of the photoresist coating is removed by dipping the substrate in a dissolving liquid.

19. The method of claim 15, wherein the metal layer fully fills the groove.

20. The method of claim 15, wherein the reflective layer is formed by electroplating.

* * * * *